(12) United States Patent
Bailey et al.

(10) Patent No.: US 7,288,478 B2
(45) Date of Patent: Oct. 30, 2007

(54) METHOD FOR PERFORMING CHEMICAL SHRINK PROCESS OVER BARC (BOTTOM ANTI-REFLECTIVE COATING)

(75) Inventors: Todd Christopher Bailey, Fishkill, NY (US); Colin J. Brodsky, Salt Point, NY (US); Allen H. Gabor, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/160,670

(22) Filed: Jul. 5, 2005

(65) Prior Publication Data

US 2007/0010091 A1    Jan. 11, 2007

(51) Int. Cl.
*H01L 21/4763*    (2006.01)

(52) U.S. Cl. .................. 438/637; 438/733; 438/706
(58) Field of Classification Search ................ 438/637, 438/733, 706
See application file for complete search history.

(56) References Cited

U.S. PATENT DOCUMENTS

| | | | |
|---|---|---|---|
| 7,083,898 B1 * | 8/2006 | Bailey et al. | 430/314 |
| 2003/0219988 A1 * | 11/2003 | Shan et al. | 438/725 |
| 2004/0041272 A1 * | 3/2004 | Signorini | 257/774 |
| 2005/0084661 A1 * | 4/2005 | Hosoi et al. | 428/210 |
| 2006/0154412 A1 * | 7/2006 | Brodsky et al. | 438/197 |

* cited by examiner

*Primary Examiner*—Thao P. Le
(74) *Attorney, Agent, or Firm*—Schmeiser, Olsen & Watts; Steven Capella

(57) ABSTRACT

A structure and a method for forming the same. The method comprises providing a structure including (a) a hole layer, (b) a BARC (bottom antireflective coating) layer on the top of the hole layer, and (c) a patterned photoresist layer on top of the BARC layer and having a photoresist hole; etching the BARC layer through the photoresist hole to extend the photoresist hole to the hole layer; performing the chemical shrinking process to shrink the extended photoresist hole; and etching the hole layer through the shrunk, extended photoresist hole so as to form a hole in the hole layer.

7 Claims, 10 Drawing Sheets

METHOD FOR PERFORMING CHEMICAL SHRINK PROCESS OVER BARC (BOTTOM ANTI-REFLECTIVE COATING)

TECHNICAL FIELD

The present invention relates to lithographic chemical shrink processes, and more specifically, to improvements to lithographic chemical shrink processes.

RELATED ART

During the fabrication of a semiconductor integrated circuit (IC), contact holes (i.e., openings) are typically formed in a dielectric layer and then filled with metal (e.g., copper) to provide electric accesses to devices of the IC underneath the dielectric layer. In one conventional method, these contact holes can be formed using a traditional photolithographic process. As the contact holes become smaller and smaller in size with, for example, successive technology generations, there is a need for improvements to the traditional photolithographic process for printing (i.e., creating) smaller contact holes.

Therefore, there is a need for contact hole printing processes that allow printing contact holes relatively smaller than those of the prior art.

SUMMARY OF THE INVENTION

The present invention provides a structure formation method, comprising providing a structure including (a) a hole layer having a top hole layer surface, (b) a BARC (bottom antireflective coating) layer on the top hole layer surface, and (c) a patterned photoresist layer on top of the BARC layer, wherein the patterned photoresist layer comprises a photoresist hole such that a top BARC surface of the BARC layer is exposed to the surrounding ambient at a bottom wall of the photoresist hole; extending the photoresist hole by removing a portion of the BARC layer directly beneath the bottom wall of the photoresist hole such that an area of the top hole layer surface is exposed to the surrounding ambient via the extended photoresist hole, wherein said extending the photoresist hole is performed before any deposition of any layer on the patterned photoresist layer; and depositing a hole shrinking film (i) on the patterned photoresist layer, (ii) on a side wall of the extended photoresist hole, and (iii) on the bottom wall of the extended photoresist hole after said extending the photoresist hole is performed.

The present invention also provides structure formation method, comprising providing a structure including (a) a hole layer having a top hole layer surface, (b) an acid containing layer on the top hole layer surface, wherein the acid containing layer comprises acids necessary for a chemical shrink process, and (c) a patterned photoresist layer on top of the acid containing layer, wherein the patterned photoresist layer comprises a photoresist hole such that a top acid containing layer surface of the acid containing layer is exposed to the surrounding ambient at a bottom wall of the photoresist hole; extending the photoresist hole by removing a portion of the acid containing layer directly beneath the bottom wall of the photoresist hole such that an area of the top hole layer surface is exposed to the surrounding ambient via the extended photoresist hole, wherein said extending the photoresist hole is performed before any deposition of any layer on the patterned photoresist layer, and wherein said extending the photoresist hole undercuts the patterned photoresist layer; and depositing a hole shrinking film (i) on the patterned photoresist layer, (ii) on a side wall of the extended photoresist hole, and (iii) on the bottom wall of the extended photoresist hole after said extending the photoresist hole is performed.

The present invention also provides a structure, comprising (a) a hole layer including a top hole layer surface; (b) a BARC (bottom antireflective coating) layer being on the top hole layer surface and comprising a BARC hole in the BARC layer; (c) a photoresist layer being on top of the BARC layer and being in direct physical contact with the BARC layer via a first common interfacing surface, wherein the photoresist layer comprises a photoresist hole directly above the BARC hole; and (d) a polymerized hole shrinking region in the photoresist hole and the BARC hole, wherein the polymerized hole shrinking region is in direct physical contact with the hole layer.

The present invention provides contact hole printing processes that allow printing contact holes relatively smaller than those of the prior art.

DETAILED DESCRIPTION OF THE INVENTION

Figure 1A:
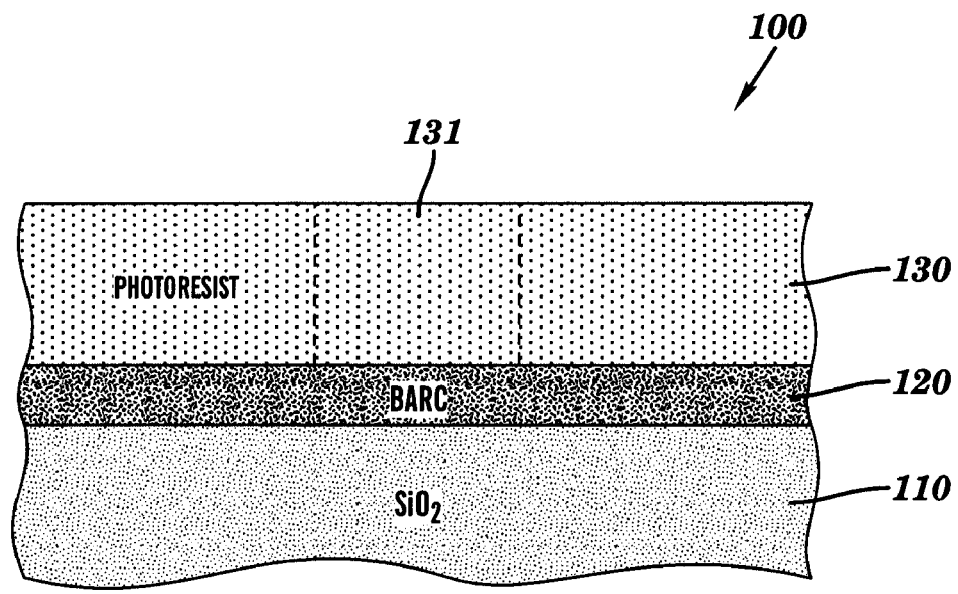
FIGS. 1A-1F illustrate the steps of a first contact hole printing process, in accordance with embodiments of the present invention.
Figure 1B:
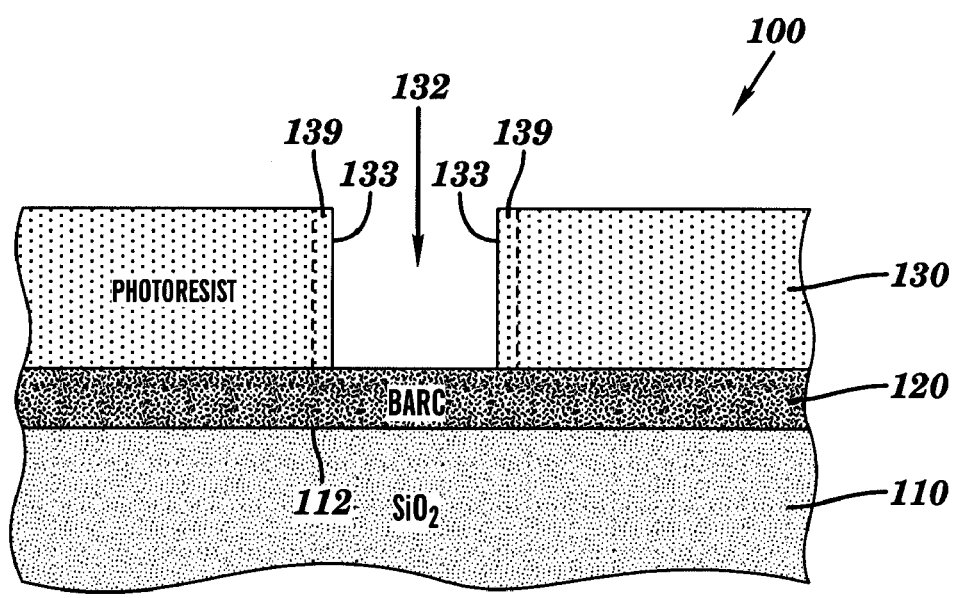

FIGS. 1A-1F illustrate the steps of a first contact hole printing process, in accordance with embodiments of the present invention. More specifically, with reference to FIG. 1A, in one embodiment, the first contact hole printing process starts out with a structure 100 including a contact hole layer 110 (comprising a dielectric material such as $SiO_2$ in one embodiment) to be patterned with contact holes. The contact hole layer 110 is formed on a semiconductor substrate (not shown for simplicity). The structure 100 further comprises (i) a BARC (bottom antireflective coating) layer 120 on top of the contact hole layer 110 and (ii) a photoresist layer 130 on top of the BARC layer 120.

Next, in one embodiment, the photoresist layer 130 is exposed to light through a mask (not shown, but typically placed over the photoresist layer 130) containing clear and opaque features such that a region 131 of the photoresist layer 130 is exposed to light while other regions of the photoresist layer 130 are not exposed to light, in this case drawn to reflect a positive-tone photoresist. The BARC layer 120 ensures that a substantial portion of light that passes through the photoresist layer 130 is absorbed by the BARC layer 120 without being reflected back to the photoresist layer 130 by any layer(s) beneath the BARC layer 120 (including the contact hole layer 110).

In one embodiment, assume that positive-tone optical lithography is used. In other words, the photoresist layer 130 comprises a positive-tone photoresist material such that regions of the photoresist layer 130 exposed to light change from originally insoluble to soluble in a first photoresist developer (a solvent) while other regions of the photoresist layer 130 not exposed to light remain insoluble in the first photoresist developer. As a result, with reference to FIG. 1B, in one embodiment, the first photoresist developer is used to develop away (remove) the exposed-to-light region 131 (FIG. 1A) of the photoresist layer 130 (called development process) resulting in a photoresist hole 132 in the patterned photoresist layer 130.

It should be noted that when the photoresist layer 130 is exposed to light, the intensity of energy reaching the photoresist layer 130 is at its highest at the center of the region 131 (FIG. 1A) and decays at the perimeter of the region 131 (FIG. 1A). As a result, a region 139 abutting the region 131 (FIG. 1A) does not attain an acid concentration level required for inducing photoresist development. Therefore, when the region 131 (FIG. 1A) is later removed, the region 139 remains and contains some photo acids (called residual photo acids).

Figure 1C:
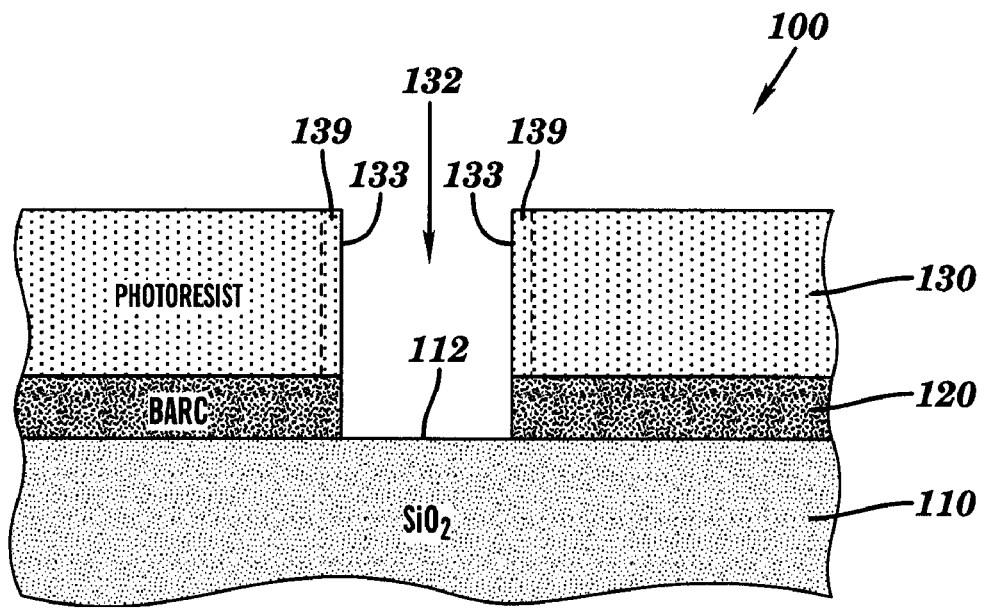

Next, in one embodiment, the patterned photoresist layer 130 is used as a blocking mask for directionally (vertically) etching the BARC layer 120 through the photoresist hole 132 so as to extend the photoresist hole 132 further down until a top surface 112 of the $SiO_2$ contact hole layer 110 is exposed to the surrounding ambient through the photoresist hole 132 as shown in FIG. 1C. In one embodiment, the directional etching of the BARC layer 120 is a RIE (reactive ion etching) process.

Figure 1D:
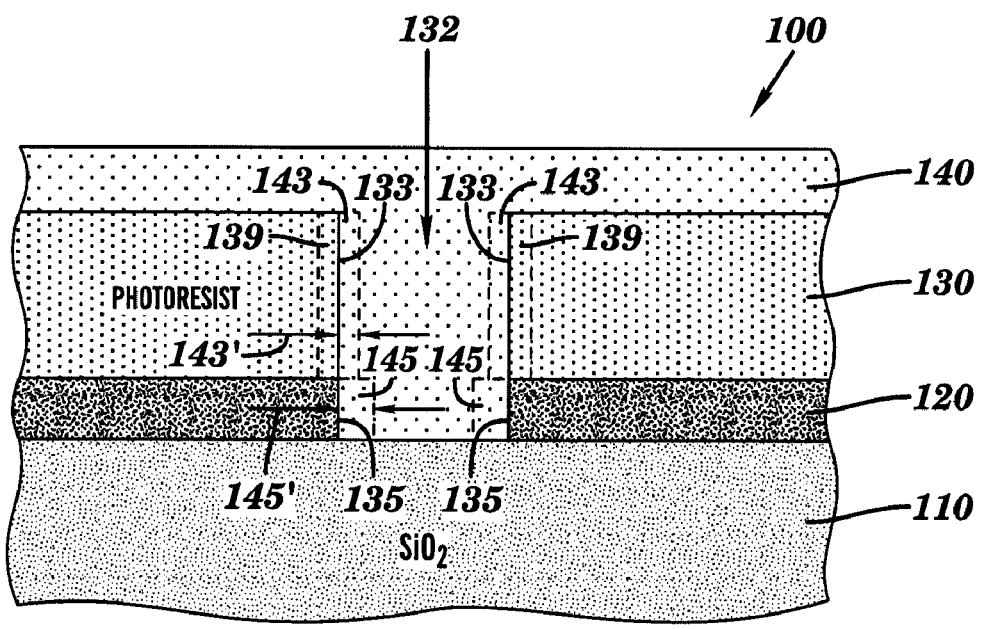

Next, with reference to FIG. 1D, in one embodiment, a hole shrinking film 140 is formed on top of the entire structure 100 of FIG. 1C by, illustratively, a spin-on process such that the hole shrinking film 140 completely fills the photoresist hole 132 and such that the hole shrinking film 140 and the BARC layer 120 have a common surface 135.

In one embodiment, the hole shrinking film 140 comprises a material which, when coming into direct contact with the residual photo acids at a high temperature, becomes solid and capable of withstanding a subsequent etching of the BARC layer 120 and the contact hole layer 110 during the formation of a contact hole 114 (FIG. 1F) in the contact hole layer 110. More specifically, in one embodiment, the hole shrinking film 140 comprises a water-soluble polymer (or alcohol-soluble polymer) and can be formed by spin-applying the water-soluble polymer on top of the entire structure 100 of FIG. 1C. Next, the structure 100 is baked to an elevated temperature such that (i) the residual photo acids in the region 139 diffuse into a region 143 of the hole shrinking film 140 via the side wall 133 and (ii) BARC acids in the BARC layer 120 diffuse into a region 145 of the hole shrinking film 140 via the common surface 135.

In one embodiment, the acid concentration in the region 139 is smaller than the acid concentration in the BARC layer 120. As a result, the acid diffusion from the region 139 into the region 143 is at a lower rate than the acid diffusion from the BARC layer 120 into the region 145 resulting in a thickness 143' of the region 143 being smaller than a thickness 145' of the region 145. In other words, different acid concentrations in the region 139 and the BARC layer 120 results in different acid diffusion rates from the region 139 and the BARC layer 120 into the regions 143 and 145, respectively. However, it should also be noted that temperature also affects the acid diffusion rates from the region 139 and the BARC layer 120 into the regions 143 and 145, respectively. For instance, the acids in the region 139 may be more mobile than the acids in the BARC layer 120 upon heating above the glass transition temperature ($T_g$). Since the BARC is conventionally cross-linked, there is no such transition point in the BARC. In one embodiment, the thicknesses 143' and 145' are controlled by (i) the bake temperature at which the structure 100 is baked and (ii) the duration of the bake step. The higher the bake temperature and the longer the structure 100 is baked, the larger the thicknesses 143' and 145'.

At the elevated temperature, the diffused residual photo acids in the region 143 catalyze cross-linking reactions (i.e., polymerization) in the region 143 causing the region 143 to change from originally soluble to insoluble in a first post-shrink rinse chemical (e.g., water).

Similarly, at the elevated temperature, the diffused BARC acids in the region 145 catalyze cross-linking reactions (i.e., polymerization) in the region 145 causing the region 145 to change from originally soluble to insoluble in the first post-shrink rinse chemical.

Figure 1E:
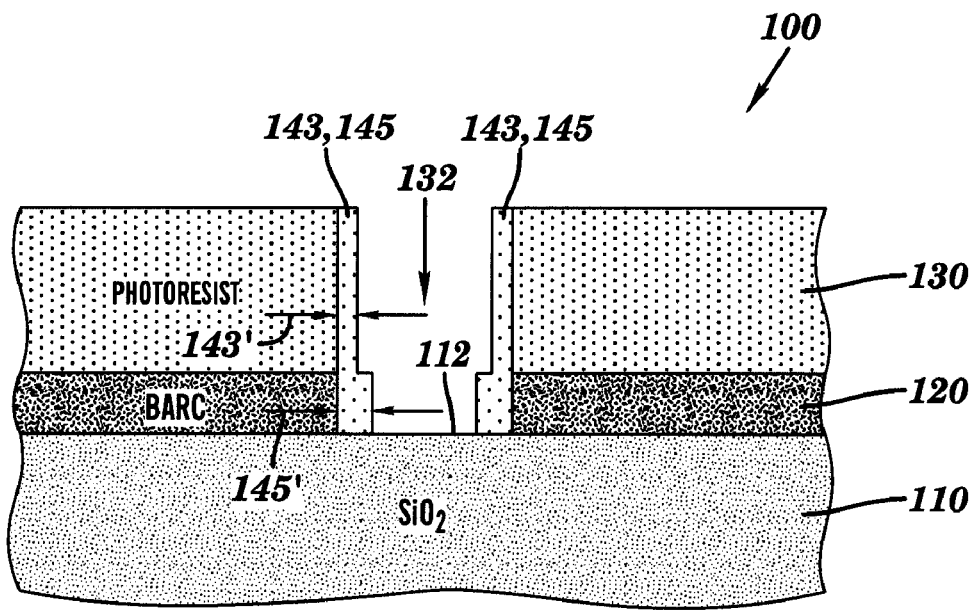

Next, the first post-shrink rinse chemical is used to the remove the entire hole shrinking film 140 except the insoluble regions 143 and 145 (also referred to as the region 143,145) such that the photoresist hole 132 is reopened and such that the top surface 112 of the contact hole layer 110 is again exposed to the surrounding ambient through the reopened photoresist hole 132 as shown in FIG. 1E. This process can be referred to as the first post-shrink rinse.

Figure 1F:
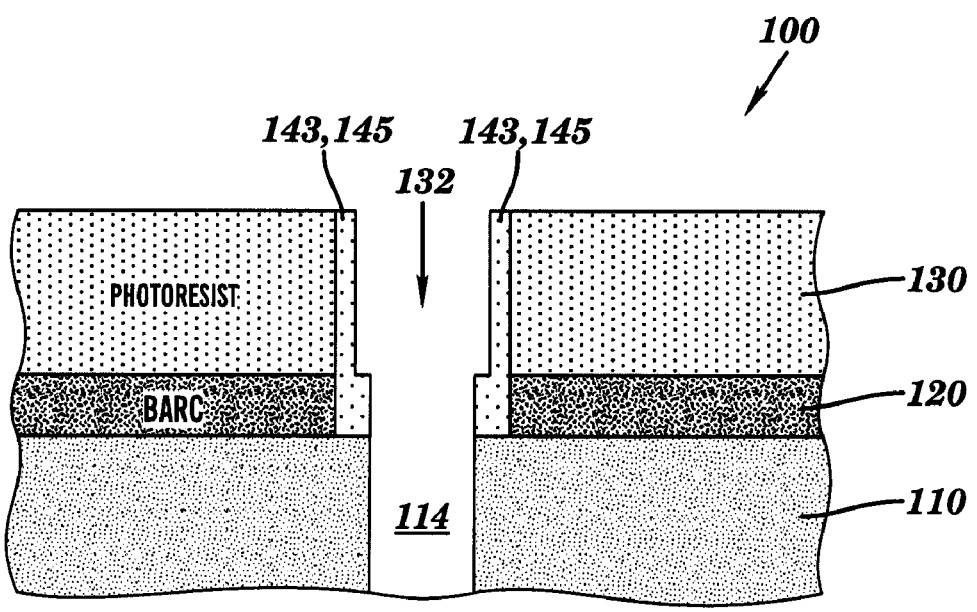

Next, with reference to FIG. 1F, in one embodiment, the contact hole 114 is formed in the contact hole layer 110 directly beneath and aligned with the reopened photoresist hole 132. Illustratively, the contact hole 142 is formed by directionally etching (e.g., RIE etching in one embodiment) the contact hole layer 110 through the photoresist hole 132. In one embodiment, the contact hole 114 is then filled with an electrically conducting material (not shown) such as copper to provide electric access to device(s) (not shown) underneath the contact hole layer 110.

FIGS. 2A-2E illustrate the steps of a second contact hole printing process, in accordance with embodiments of the present invention. More specifically, with reference to FIG. 2A, in one embodiment, the second contact hole printing process starts out with a structure 200 including a contact hole layer 210 (comprising a dielectric material such as $SiO_2$ in one embodiment) formed on a semiconductor substrate (not shown for simplicity). The structure 200 further comprises (i) a BARC (bottom antireflective coating) layer 220 on top of the contact hole layer 210 and (ii) a photoresist layer 230 on top of the BARC layer 220.

For simplicity, all reference numerals herein have three numeric digits starting with the numeric figure number. In addition, similar regions have identical reference numerals except for the first digit which is used to indicate the numeric figure number. For example, the BARC layer 120 (FIG. 1A) and the BARC layer 220 (FIG. 2A) are similar.

Next, in one embodiment, the photoresist layer 230 is exposed to light through a mask (not shown, but typically projected onto the photoresist layer 230) containing clear and opaque features such that a region 231 of the photoresist layer 130 is exposed to light while other regions of the photoresist layer 230 are not exposed to light. The BARC layer 230 optimizes the image quality by suppressing reflections within the resist.

In one embodiment, assume that positive-tone optical lithography is used. As a result, with reference to FIG. 2B, a second photoresist developer is used to develop away (remove) the exposed-to-light region 231 (FIG. 2A) of the photoresist layer 230 (called development process) resulting in a photoresist hole 232 in the patterned photoresist layer 230.

It should be noted that when the photoresist layer 230 is exposed to light, the intensity of energy reaching the photoresist layer 230 is at its highest at the center of the region 231 (FIG. 2A) and decays at the perimeter of the region 231

Figure 2A:
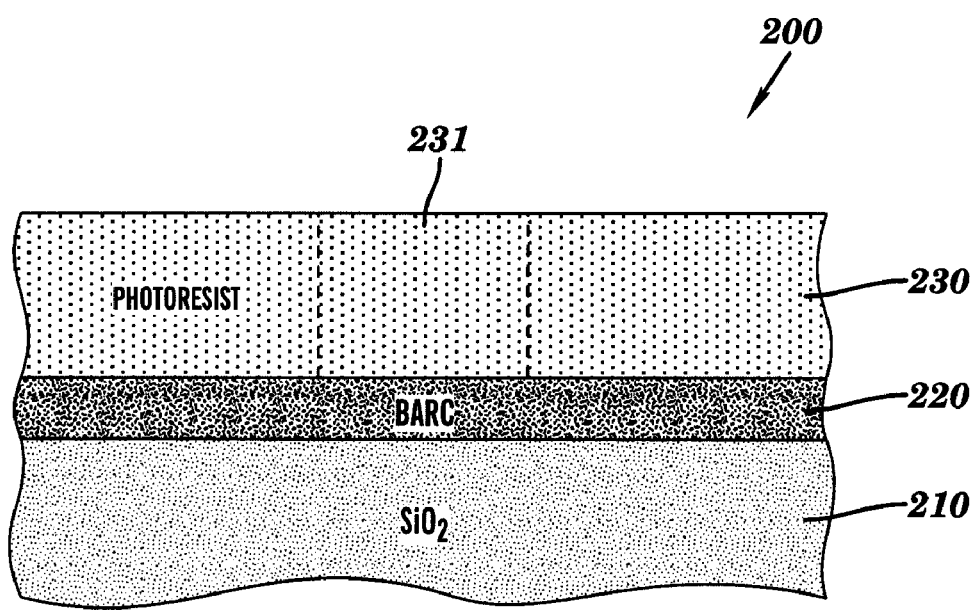
FIGS. 2A-2E illustrate the steps of a second contact hole printing process, in accordance with embodiments of the present invention.

(FIG. 2A). As a result, a region 239 abutting the region 231 (FIG. 2A) does not attain an acid concentration level required for inducing photoresist development. Therefore, when the region 231 (FIG. 2A) is later removed, the region 239 remains and contains some photo acids (called residual photo acids).

In one embodiment, the BARC layer 220 comprises a wet-developable material such that the second photoresist developer which is used to develop the photoresist layer 230 also isotropically etches the BARC layer 220 stopping at the $SiO_2$ contact hole layer 210. Alternatively, an isotropic etching of the BARC layer 220 separate from the development of the photoresist layer 230 (i.e., using etchants other than the second photoresist developer) is performed. As a result of the development of the photoresist layer 230 and the subsequent isotropic etching of the BARC layer 220, a top surface 212 of the contact hole layer 210 is exposed to the surrounding ambient through the photoresist hole 232. In one embodiment, the isotropic etching of the BARC layer 220 undercuts the photoresist layer 230 as shown in FIG. 2B.

Figure 2B:
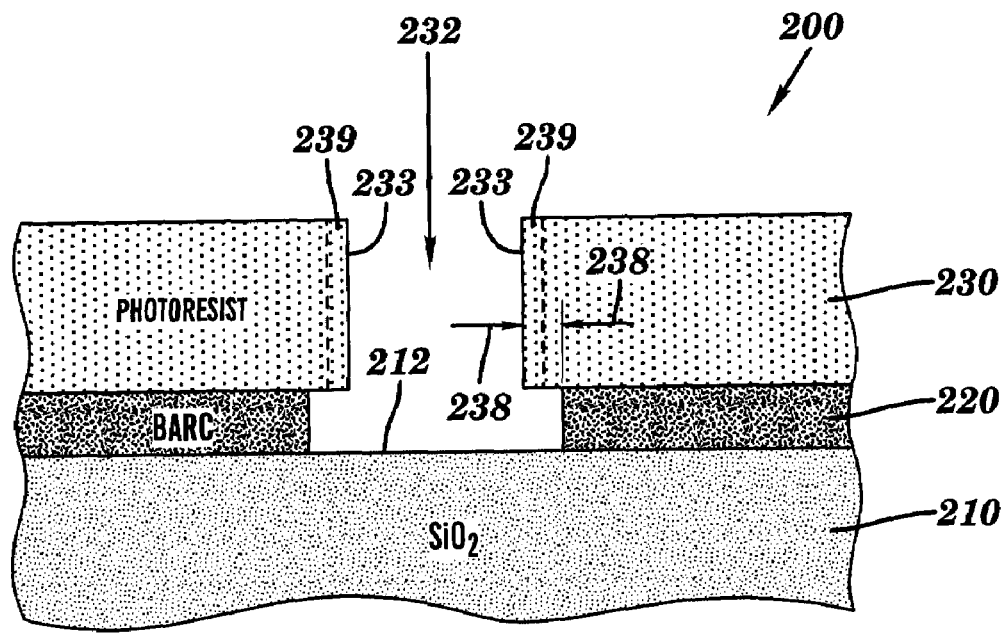
Figure 2C:
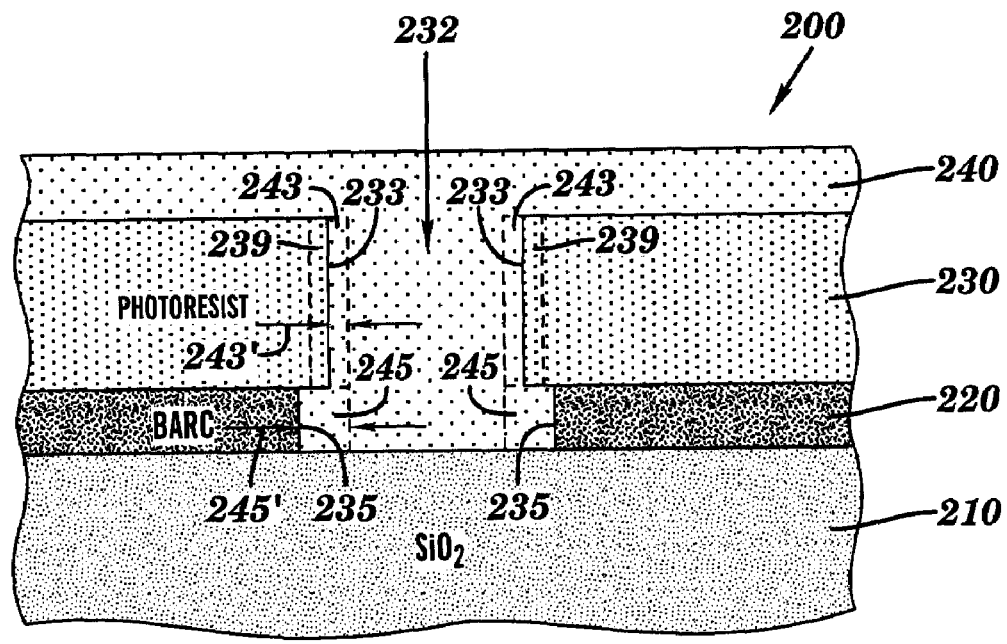

Next, with reference to FIG. 2C, in one embodiment, a hole shrinking film 240 is formed on top of the entire structure 200 of FIG. 2B by, illustratively, a spin-on process such that the hole shrinking film 240 completely fills the photoresist hole 232. In one embodiment, the hole shrinking film 240 comprises a water-soluble polymer and can be formed by spin-applying the water-soluble polymer on top of the entire structure 200 of FIG. 2B.

Next, the structure 200 is baked to an elevated temperature such that (i) the residual photo acids in the region 239 diffuse into a region 243 of the hole shrinking film 240 via the side wall 233 and (ii) BARC acids in the BARC layer 220 diffuse into a region 245 of the hole shrinking film 240 via the common surface 235.

In one embodiment, the acid concentration in the region 239 is smaller than the acid concentration in the BARC layer 220. As a result, the acid diffusion from the region 239 into the region 243 is at a lower rate than the acid diffusion from the BARC layer 220 into the region 245 resulting in a thickness 243' of the region 243 being smaller than a thickness 245' of the region 245. In one embodiment, the thicknesses 243' and 245' are controlled by (i) the bake temperature at which the structure 200 is baked and (ii) the duration of the bake step. The higher the bake temperature and the longer the structure 200 is baked, the larger the thicknesses 243' and 245'.

In one embodiment, the bake temperature and the duration of the bake step for the structure 200 of FIG. 2B are such that the difference of thicknesses 243' and 245' is equal to the undercut degree 238 (FIG. 2B).

At the elevated temperature, the diffused residual photo acids in the region 243 catalyze cross-linking reactions (i.e., polymerization) in the region 243 causing the region 243 to change from originally soluble to insoluble in a second post-shrink rinse chemical (e.g., water).

Similarly, at the elevated temperature, the diffused BARC acids in the region 245 catalyze cross-linking reactions (i.e., polymerization) in the region 245 causing the region 245 to change from originally soluble to insoluble in the second post-shrink rinse chemical.

Figure 2D:
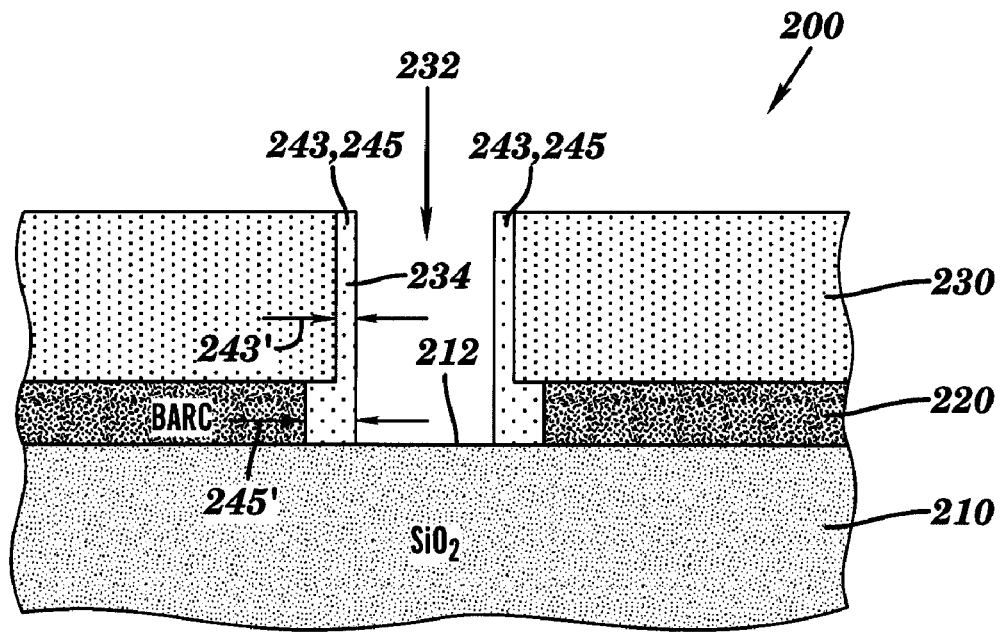

Next, the second post-shrink rinse chemical is used to the remove the entire hole shrinking film 240 except the insoluble regions 243 and 245 (also referred to as the region 243,245) such that the top surface 212 of the contact hole layer 210 is again exposed to the surrounding ambient as shown in FIG. 2D. This process can be referred to as the second post-shrink rinse.

Because the difference of thicknesses 243' and 245' is equal to the undercut degree 238 (FIG. 2B), the side wall 234 of the reopened photoresist hole 232 is vertical through out the photoresist layer 230 and the BARC layer 220.

Figure 2E:
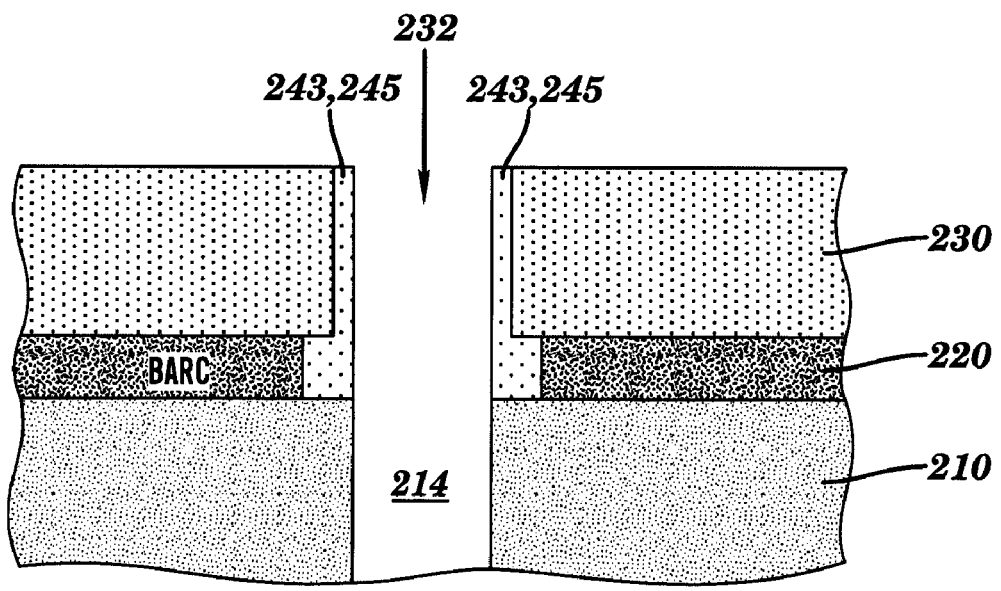

Next, with reference to FIG. 2E, in one embodiment, the contact hole 214 is formed in the contact hole layer 210 directly beneath and aligned with the photoresist hole 232. Illustratively, the contact hole 242 is formed by directionally etching (e.g., RIE etching in one embodiment) the contact hole layer 210 through the photoresist hole 232. In one embodiment, the contact hole 214 is then filled with a electrically conducting material (not shown) such as copper to provide electric access to device(s) (not shown) underneath the contact hole layer 210.

FIGS. 3A-3F illustrate the steps of a third contact hole printing process, in accordance with embodiments of the present invention. More specifically, with reference to FIG. 3A, in one embodiment, the second contact hole printing process starts out with a structure 300 including a contact hole layer 310 (comprising a dielectric material such as $SiO_2$ in one embodiment) formed on a semiconductor substrate (not shown for simplicity). The structure 300 further comprises (i) a BARC (bottom antireflective coating) layer 320 on top of the contact hole layer 310 and (ii) a photoresist layer 330 on top of the BARC layer 320.

Next, in one embodiment, the photoresist layer 330 is exposed to light through a mask (not shown, but typically formed on top of the photoresist layer 330) containing clear and opaque features such that a region 331 of the photoresist layer 330 is exposed to light while other regions of the photoresist layer 330 are not exposed to light. The BARC layer 330 ensures that a substantial portion of light that passes through the photoresist layer 330 is absorbed by the BARC layer 330 without being reflected back to the photoresist layer 330 by any layer(s) beneath the BARC layer 330 (including the contact hole layer 310.

In one embodiment, assume that positive-tone optical lithography is used. As a result, with reference to FIG. 3B, a third photoresist developer is used to develop away (remove) the exposed-to-light region 331 (FIG. 3A) of the photoresist layer 330 (called development process) resulting in a photoresist hole 332 in the patterned photoresist layer 330.

Figure 3A:
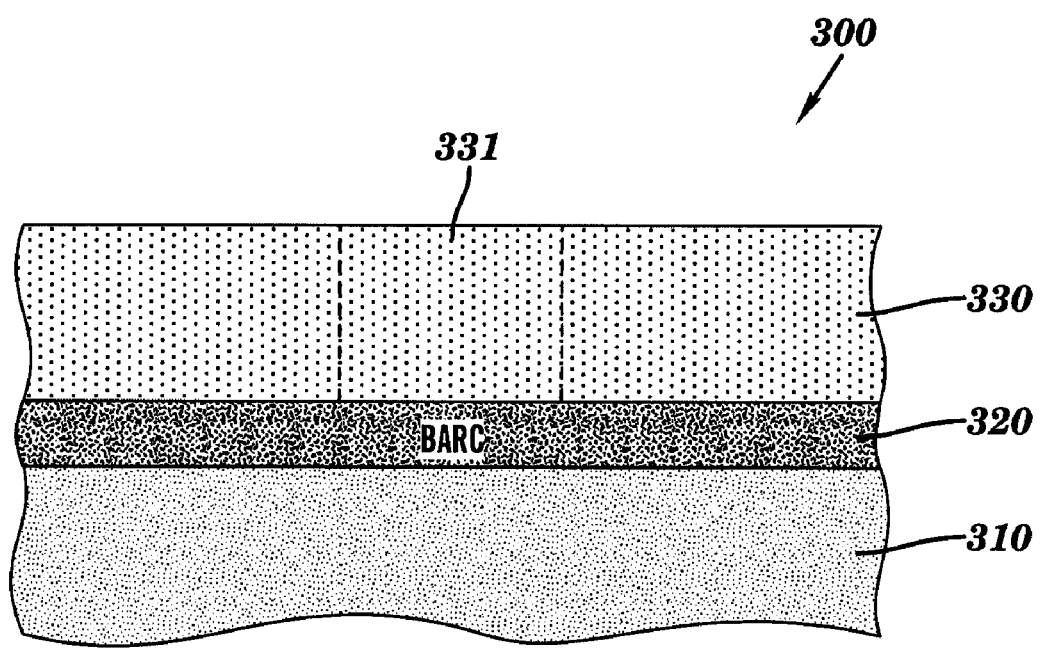
FIGS. 3A-3F illustrate the steps of a third contact hole printing process, in accordance with embodiments of the present invention.

It should be noted that when the photoresist layer 330 is exposed to light, the intensity of energy reaching the photoresist layer 330 is at its highest at the center of the region 331 (FIG. 3A) and decays at the perimeter of the region 331 (FIG. 3A). As a result, a region 339 abutting the region 331 (FIG. 3A) does not attain an acid concentration level required for inducing photoresist development. Therefore, when the region 331 (FIG. 3A) is later removed, the region 339 remains and contains some photo acids (called residual photo acids).

Figure 3B:
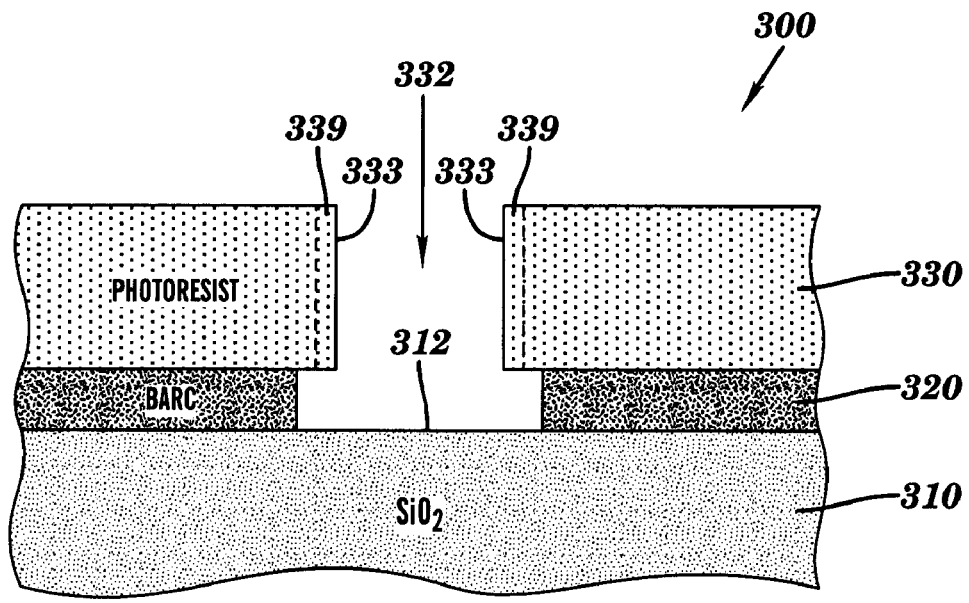

In one embodiment, the BARC layer 320 comprises a wet-developable material such that the second photoresist developer which is used to develop the photoresist layer 330 also isotropically etches the BARC layer 320 stopping at the $SiO_2$ contact hole layer 310. Alternatively, an isotropic etching of the BARC layer 320 separate from the development of the photoresist layer 330 (i.e., using etchants other than the third photoresist developer) is performed. As a result of the development of the photoresist layer 330 and the subsequent isotropic etching of the BARC layer 320, a top surface 312 of the contact hole layer 310 is exposed to the surrounding ambient through the photoresist hole 332. In one embodiment, the isotropic etching of the BARC layer 320 undercuts the photoresist layer 330 as shown in FIG. 3B.

Figure 3C:
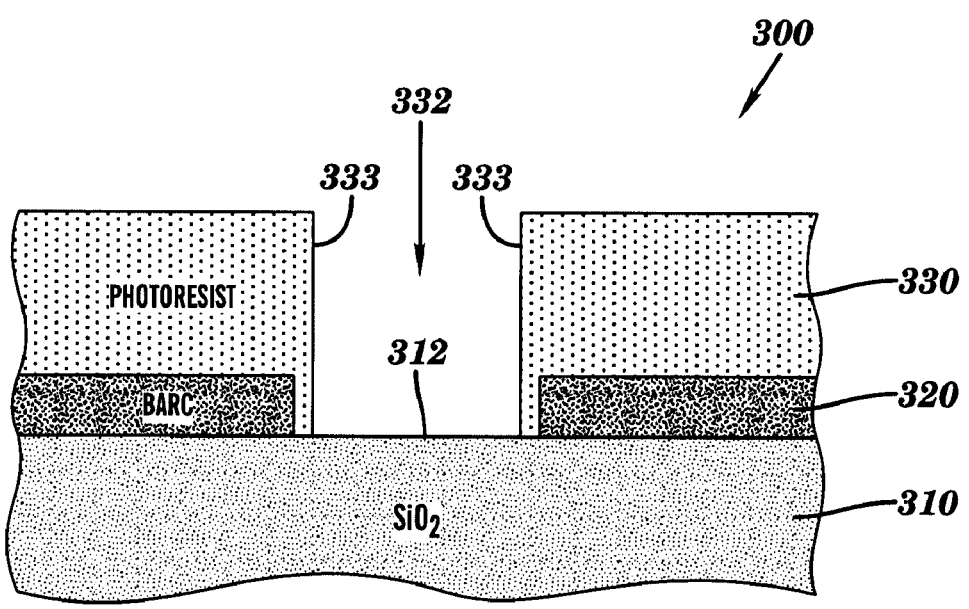

Next, with reference to FIG. 3C, in one embodiment, the photoresist layer 330 is thermally reflowed at a reflow temperature in a range of 100-200° C. in a duration in a range of 60-90 seconds such that some material of the photoresist layer 330 flows down under the force of gravity and covers the BARC layer 320. The heat of the flow process not only generates acids through out the patterned photoresist layer 330 but also uniformly redistributes the residual photo acids from the region 339 (FIG. 3B) throughout the patterned photoresist layer 330.

Figure 3D:
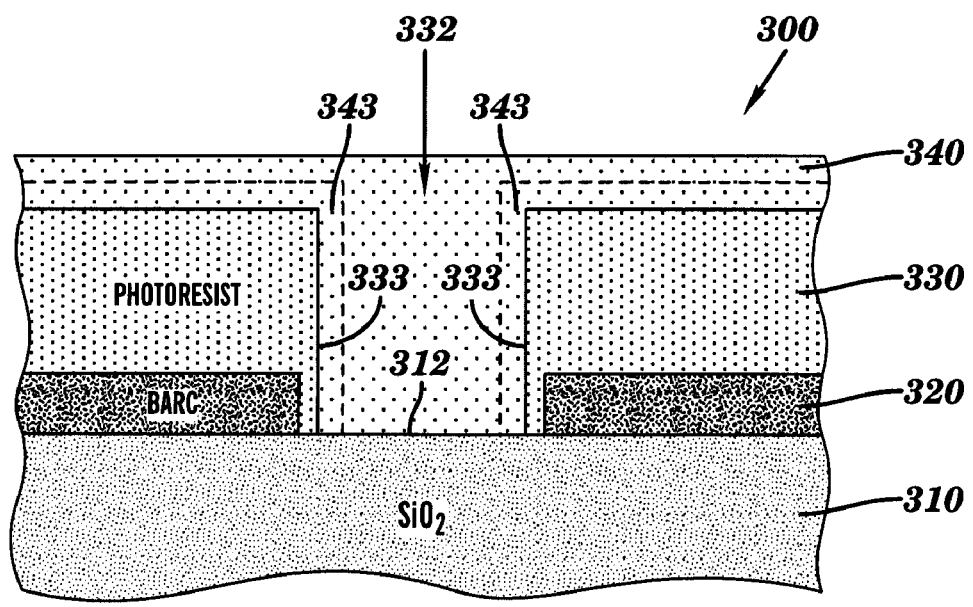

Next, with reference to FIG. 3D, in one embodiment, a hole shrinking film 340 is formed on top of the entire structure 300 of FIG. 3C by, illustratively, a spin-on process such that the hole shrinking film 340 completely fills the photoresist hole 332. In one embodiment, the hole shrinking film 340 comprises a water-soluble polymer and can be formed by spin-applying the water-soluble polymer on top of the entire structure 300 of FIG. 3C.

Next, the structure 300 is baked to an elevated temperature such that the acids in the region 339 diffuse into a region 343 of the hole shrinking film 340 via the side wall 333 and such that BARC. At the elevated temperature, the diffused acids in the region 343 catalyze cross-linking reactions (i.e., polymerization) in the region 343 causing the region 343 to change from originally soluble to insoluble in a third post-shrink rinse chemical (e.g., water).

Figure 3E:
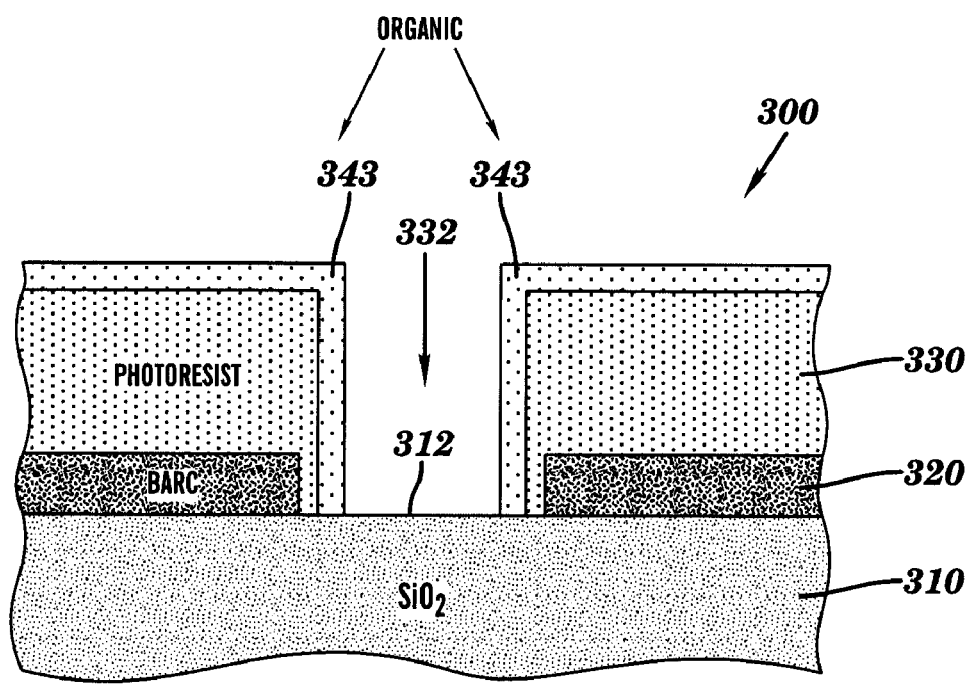

Next, the third post-shrink rinse chemical is used to the remove the entire hole shrinking film 340 except the insoluble regions 343 such that the photoresist hole 332 is reopened and such that the top surface 312 of the contact hole layer 310 is again exposed to the surrounding ambient through the reopened photoresist hole 332 as shown in FIG. 3E. This process can be referred to as the third post-shrink rinse.

Figure 3F:
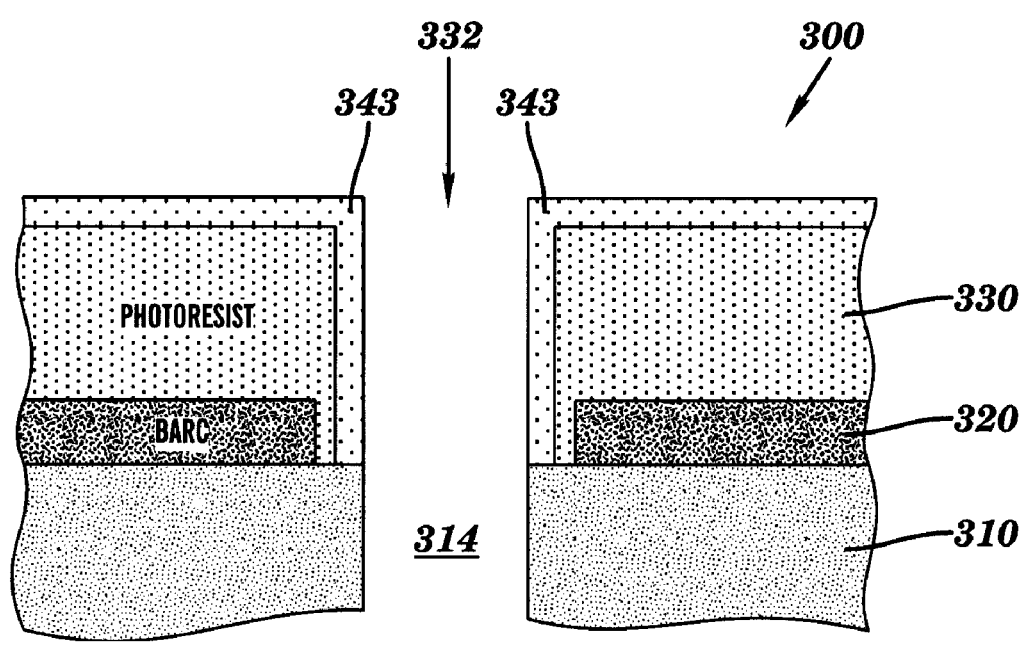

Next, with reference to FIG. 3F, in one embodiment, the contact hole 314 is formed in the contact hole layer 310 directly beneath and aligned with the photoresist hole 332. Illustratively, the contact hole 314 is formed by directionally etching (e.g., RIE etching in one embodiment) the contact hole layer 310 through the photoresist hole 332. It should be noted that the region 343 not only covers the side wall of the photoresist hole 332 but also covers the top surface of the photoresist layer 330. As a result, the photoresist layer 330 is better protected from the etching of the contact hole layer 310 during the formation of the contact hole 314. In one embodiment, the contact hole 314 is then filled with a electrically conducting material (not shown) such as copper to provide electric access to device(s) (not shown) underneath the contact hole layer 310.

In the embodiments described above, the first, second, and third contact hole printing processes are used to print contact holes 114, 214, and 314 of FIGS. 1F, 2E, and 3F, respectively. In general, any hole (not just contact holes) of any size and shape can be printed in the layers 110, 210, and 310 of FIGS. 1F, 2E, and 3F, using the first, second, and third contact hole printing processes, respectively. For instance, with reference to FIGS. 1A-1F, if a hole 114 having a shape of a long trench needs to be printed in the layer 110, the photoresist hole 132 needs to have the shape of a long trench.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A structure formation method, comprising:
   providing a structure including:
   (a) a hole layer having a top hole layer surface,
   (b) a BARC (bottom antireflective coating) layer on the top hole layer surface, and
   (c) a patterned photoresist layer on top of the BARC layer, wherein the patterned photoresist layer comprises a photoresist hole such that a top BARC surface of the BARC layer is exposed to the surrounding ambient at a bottom wall of the photoresist hole;
   extending the photoresist hole by removing a portion of the BARC layer directly beneath the bottom wall of the photoresist hole such that an area of the top hole layer surface is exposed to the surrounding ambient via the extended photoresist hole, wherein said extending the photoresist hole is performed before any deposition of any layer on the patterned photoresist layer, and wherein said extending the photoresist hole comprises a directional etching of the BARC layer through the photoresist hole; and
   depositing a hole shrinking film (i) on the patterned photoresist layer, (ii) on a side wall of the extended photoresist hole, and (iii) on the bottom wall of the extended photoresist hole after said extending the photoresist hole is performed.

2. The method of claim 1, wherein the hole shrinking film comprises a hole shrinking film material which, when coming into direct physical contact with photo acids diffusing into the hole shrinking film changes from originally soluble to insoluble in a post-shrink rinse chemical.

3. The method of claim 2, wherein the hole shrinking film material comprises a polymer.

4. The method of claim 1, further comprising:
   causing a portion of the hole shrinking film abutting the side wall of the extended photoresist hole to be polymerized;
   removing the hole shrinking film except the polymerized portion of the hole shrinking film such that the area of the top hole layer surface is again exposed to the surrounding ambient via the extended photoresist hole; and
   forming a hole in the hole layer directly beneath the extended photoresist hole after said removing the hole shrinking film.

5. The method of claim 4, wherein said causing comprises baking the patterned photoresist layer and the hole shrinking film so that residual photo acids diffusing from the patterned photoresist layer into the portion of the hole shrinking film catalyze the polymerization of the portion of the hole shrinking film.

6. The method of claim 4, wherein said forming the hole comprises directionally etching the hole layer through the extended photoresist hole.

7. The method of claim 1, wherein said directional etching of the BARC layer is a reactive ion etching (RIE) of the BARC layer.

* * * * *